US007474168B2

(12) United States Patent
Tatsumi

(10) Patent No.: US 7,474,168 B2
(45) Date of Patent: Jan. 6, 2009

(54) MODULATION-SIGNAL GENERATOR CIRCUIT, IMAGE DISPLAY APPARATUS AND TELEVISION APPARATUS

(75) Inventor: Eisaku Tatsumi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 609 days.

(21) Appl. No.: 11/168,289

(22) Filed: Jun. 29, 2005

(65) Prior Publication Data

US 2006/0001499 A1 Jan. 5, 2006

(30) Foreign Application Priority Data

Jun. 30, 2004 (JP) ............................. 2004-193474
Jun. 23, 2005 (JP) ............................. 2005-183270

(51) Int. Cl.
*H03C 3/00* (2006.01)
*G09G 3/10* (2006.01)

(52) U.S. Cl. ....................... 332/109; 315/169.3; 345/76

(58) Field of Classification Search ................. 332/109; 315/169.3
See application file for complete search history.

(56) References Cited

U.S. PATENT DOCUMENTS 6,215,466 B1 4/2001 Yamazaki et al. ............. 345/89
6,292,228 B1 9/2001 Cho ........................... 348/603
2002/0060525 A1* 5/2002 Sagano et al. ............ 315/169.3
2002/0195966 A1 12/2002 Aoki et al. ............... 315/169.3
2003/0095085 A1 5/2003 Abe .......................... 345/74.1

FOREIGN PATENT DOCUMENTS

| | | |
|---|---|---|
| JP | 5-100630 | 4/1993 |
| JP | 6-178153 | 6/1994 |
| JP | 7-181917 | 7/1995 |
| JP | 11-337909 | 12/1999 |
| JP | 2000-029425 | 1/2000 |
| JP | 2000-172217 | 6/2000 |
| JP | 2003-173159 | 6/2003 |
| JP | 2003-195800 | 7/2003 |
| JP | 2003-316312 | 11/2003 |
| KR | 2000-3694 | 1/2000 |

* cited by examiner

*Primary Examiner*—Joseph Chang
(74) *Attorney, Agent, or Firm*—Fitzpatrick, Cella, Harper & Scinto

(57) ABSTRACT

A modulation-signal generator circuit generates a modulation signal having a time width corresponding to tone data that is input. The modulation-signal generator circuit includes an output section outputting the modulation signal and a control circuit. The output section is controlled so as to set the height value of the modulation signal to a predetermined height value during a first period in a period during which one modulation signal is output and is controlled so as to set the height value of the modulation signal to a height value higher than the predetermined height value during a second period. The control circuit sets a maximum time width which is available as the first period, and sets the maximum time width in accordance with a signal generated based on an instruction of a user or sets the maximum time width in accordance with a signal indicating the characteristics of the tone data.

5 Claims, 13 Drawing Sheets

MODULATION-SIGNAL GENERATOR CIRCUIT, IMAGE DISPLAY APPARATUS AND TELEVISION APPARATUS

BACKGROUND OF THE INVENTION

1. Field of the Invention

The present invention relates to a modulation-signal generator circuit and an image display apparatus.

2. Description of the Related Art

Japanese Patent Laid-Open No. 11-337909 discloses a liquid crystal display apparatus capable of switching tone characteristic curves based on images that are input.

Japanese Patent Laid-Open No. 6-178153 discloses a gamma correction circuit capable of switching gamma correction curves based on images that are input.

Japanese Patent Laid-Open No. 2000-029425 discloses a structure using a nonuniform pixel clock (PCLK).

Japanese Patent Laid-Open No. 2003-173159 discloses a structure in which signal waveforms sequentially rise.

Japanese Patent Laid-Open No. 7-181917 discloses a control apparatus and a control method capable of searching for a single sequence from points on a tone-voltage reaction curve to obtain the sequence having the luminance.

SUMMARY OF THE INVENTION

It is desirable to provide a modulation-signal generator circuit capable of varying tone characteristics.

According to a first aspect, the present invention provides a modulation-signal generator circuit adapted to generate a modulation signal having a time width corresponding to tone data that is input. The modulation-signal generator circuit includes an output section outputting the modulation signal and a control circuit. The output section is controlled so as to set the height value of the modulation signal to a predetermined height value during a first period in a period during which one modulation signal is output and is controlled so as to set the height value of the modulation signal to a height value higher than the predetermined height value during a second period, different from the first period, in the period during which the modulation signal is output. The control circuit sets a maximum time width available as the first period, and sets the maximum time width in accordance with a signal generated based on an instruction of a user or sets the maximum time width in accordance with a signal indicating the characteristics of the tone data.

According to a second aspect, the present invention provides a modulation-signal generator circuit adapted to generate a modulation signal having a time width corresponding to tone data that is input. The modulation-signal generator circuit includes an output section generating the modulation signal and a control circuit. The output section includes a first transistor and a second transistor. One main electrode of the first transistor is connected to the side toward a first power supply used for setting the height value of the modulation signal to a predetermined height value and the other main electrode thereof is connected to the side toward the output terminal of the output section. One main electrode of the second transistor is connected to the side toward a second power supply used for setting the height value of the modulation signal to a height value higher than the predetermined height value and the other main electrode thereof is connected to the side toward the output terminal of the output section. The first transistor is turned on during a first period in a period during which one modulation signal is generated to create a state in which the output terminal is connected the first power supply through the first transistor, and the second transistor is turned on during a second period, different from the first period, in the period during which one modulation signal is generated to create a state in which the output terminal is connected to the second power supply through the second transistor. The control circuit sets a maximum time width available as the first period, and sets the maximum time width in accordance with a signal generated based on an instruction of a user or sets the maximum time width in accordance with a signal indicating the characteristics of the tone data.

According to a third aspect, the present invention provides an image display apparatus including the modulation-signal generator circuit and a display device driven in response to the modulation signal.

According to a fourth aspect, the present invention provides an image display apparatus including a modulation-signal generator circuit adapted to generate a modulation signal having a time width corresponding to tone data that is input and a display device driven in response to the modulation signal. The modulation-signal generator circuit includes an output section outputting the modulation signal and a control circuit. The output section is controlled so as to set the height value of the modulation signal to a predetermined height value during a first period in a period during which one modulation signal is output and is controlled so as to set the height value of the modulation signal to a height value higher than the predetermined height value during a second period, different from the first period, in the period during which the modulation signal is output. The control circuit sets a maximum time width available as the first period, and the control circuit sets the maximum time width in accordance with a signal generated based on an instruction of a user, sets the maximum time width in accordance with a signal indicating the characteristics of the tone data, or sets the maximum time width in accordance with a signal indicating the ambient brightness of the image display apparatus.

According to a fifth aspect, the present invention provides an image display apparatus including a modulation-signal generator circuit adapted to generate a modulation signal having a time width corresponding to tone data that is input and a display device driven in response to the modulation signal. The modulation-signal generator circuit includes an output section outputting the modulation signal and a control circuit. The output section includes a first transistor and a second transistor. One main electrode of the first transistor is connected to the side toward a first power supply used for setting the height value of the modulation signal to a predetermined height value and the other main electrode thereof is connected to the side toward the output terminal of the output section. One main electrode of the second transistor is connected to the side toward a second power supply used for setting the height value of the modulation signal to a height value higher than the predetermined height value and the other main electrode thereof is connected to the side toward the output terminal of the output section. The first transistor is turned on during a first period in a period during which one modulation signal is generated to create a state in which the output terminal is connected the first power supply through the first transistor, and the second transistor is turned on during a second period, different from the first period, in the period during which one modulation signal is generated to create a state in which the output terminal is connected to the second power supply through the second transistor. The control circuit sets a maximum time width available as the first period, and the control circuit sets the maximum time width in accordance with a signal generated based on an instruction of a user, sets the maximum time width in accordance with a signal indicating the characteristics of the tone data, or sets the maximum time width in accordance with a signal indicating the ambient brightness of the image display apparatus.

The image display apparatus may further includes a plurality of scanning lines, a plurality of modulation lines, and a scanning circuit that sequentially applies scanning signals to the plurality of scanning lines. A plurality of modulation-signal generator circuits may be provided corresponding to the plurality of modulation lines. A plurality of display devices may be connected by the plurality of scanning lines and the plurality of modulation lines that form matrix wiring.

The present invention provides a television apparatus including a tuner for television broadcasting signals and the image display apparatus. The image display apparatus receives a signal from the tuner to display an image based on the signal supplied from the tuner.

According to the present invention, it is possible to realize a modulation-signal generator circuit capable of varying the tone characteristics.

Further features and advantages of the present invention will become apparent from the following description of exemplary embodiments with reference to the attached drawings.

DESCRIPTION OF THE EMBODIMENTS

An image display apparatus according to the present invention is, for example, a liquid crystal display apparatus, a plasma display apparatus, and an electron beam display apparatus. Particularly, the present invention is applicable to the electron beam display apparatus with respect to display of multiple bits.

Figure 1:
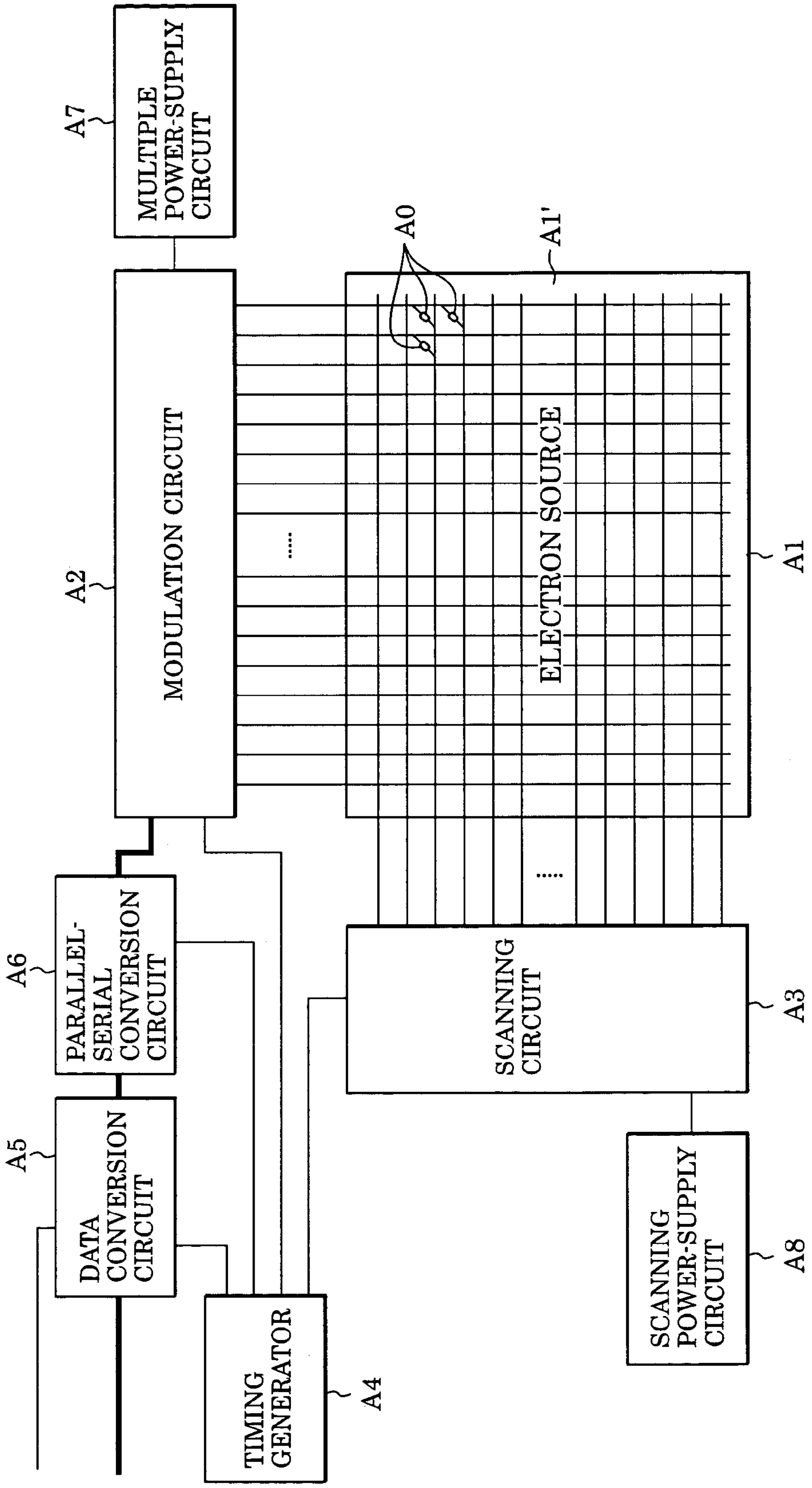
FIG. 1 is a schematic block diagram showing a driving unit in an image display apparatus according to an embodiment of the present invention.

FIG. 1 is a schematic block diagram showing a driving unit in an image display apparatus according to an embodiment of the present invention. Referring to FIG. 1, the driving unit includes a modulation circuit A2, a scanning circuit A3, a timing generator A4, a data conversion circuit A5, a parallel-serial conversion circuit A6, a multiple power-supply circuit A7, and a scanning power-supply circuit A8. The timing generator A4 and the data conversion circuit A5 form a data output circuit. The driving unit drives an electron source A1 forming an image display unit A1' of the image display apparatus. The scanning circuit A3 has a plurality of output terminals that are connected to the respective scanning lines (horizontal lines) of the image display unit. The modulation circuit A2 has a plurality of output terminals that are connected to the respective modulation lines (vertical lines) of the image display unit. The scanning lines and the modulation lines form matrix lines. A plurality of display devices A0 are connected through the matrix lines. Although the display devices are arranged at intersections of the scanning lines and the modulation lines, only some of the display devices are shown in FIG. 1 for clarity. According to this embodiment, electron emitting devices are used as the display devices A0. The image display unit has a fluorescent material that is irradiated with electrons emitted from the electron emitting devices to emit light rays. Images are formed with the emission of the light rays from the fluorescent material. According to this embodiment, surface conduction electron-emitting devices are used as the electron emitting devices. According to this embodiment, the data conversion circuit A5 serves as a control circuit for changing a state in which modulation signals are generated under a predetermined modulation-signal generating condition to a state in which the modulation signals are generated under another modulation-signal generating condition.

The data conversion circuit A5 converts luminance-tone data used for externally controlling the luminance and tone of the electron source A1 into a driving waveform data format appropriate for the modulation circuit A2. The data conversion circuit A5 serves as the control circuit according to this embodiment. Data concerning setting of the number of steps, which data is used for setting the maximum period of a predetermined height value, is output from the control circuit. The control circuit also outputs the luminance-tone data as pulse height modulation (PHM) data and pulse width modulation (PWM) data. The configuration of the data conversion circuit A5 is described below with reference to FIG. 11.

The parallel-serial conversion circuit A6 converts the driving waveform data output from the data conversion circuit A5 into PHM serial data and PWM serial data.

The scanning circuit A3, which is connected to the horizontal lines of the electron source A1, selects a horizontal line to which each signal output from the modulation circuit A2 is supplied. Although the scanning circuit A3 generally performs sequential line scanning in which the horizontal lines are sequentially selected one by one, the scanning method is not limited to the sequential line scanning. The scanning circuit A3 may perform line jump scanning, may select multiple lines, or may select a plane. In other words, the scanning circuit A3 functions as selecting means for applying a selected voltage to the horizontal lines to which the multiple electron sources to be driven, among the multiple electron sources in the electron source A1, are connected for a predetermined time and for applying a non-selected voltage thereto for a time other than the predetermined time to select the lines.

The timing generator A4 generates timing signals for the modulation circuit A2, the scanning circuit A3, the data conversion circuit A5, and the parallel-serial conversion circuit A6.

The multiple power-supply circuit A7, outputs a plurality of power supply voltages and controls the modulation circuit A2. Although the multiple power-supply circuit A7 is generally a voltage source circuit, it is not limited thereto.

The scanning power-supply circuit A8 outputs a plurality of power supply voltages and controls the scanning circuit A3. Although the scanning power-supply circuit A8 is generally a voltage source circuit, it is not limited thereto.

Figure 2:
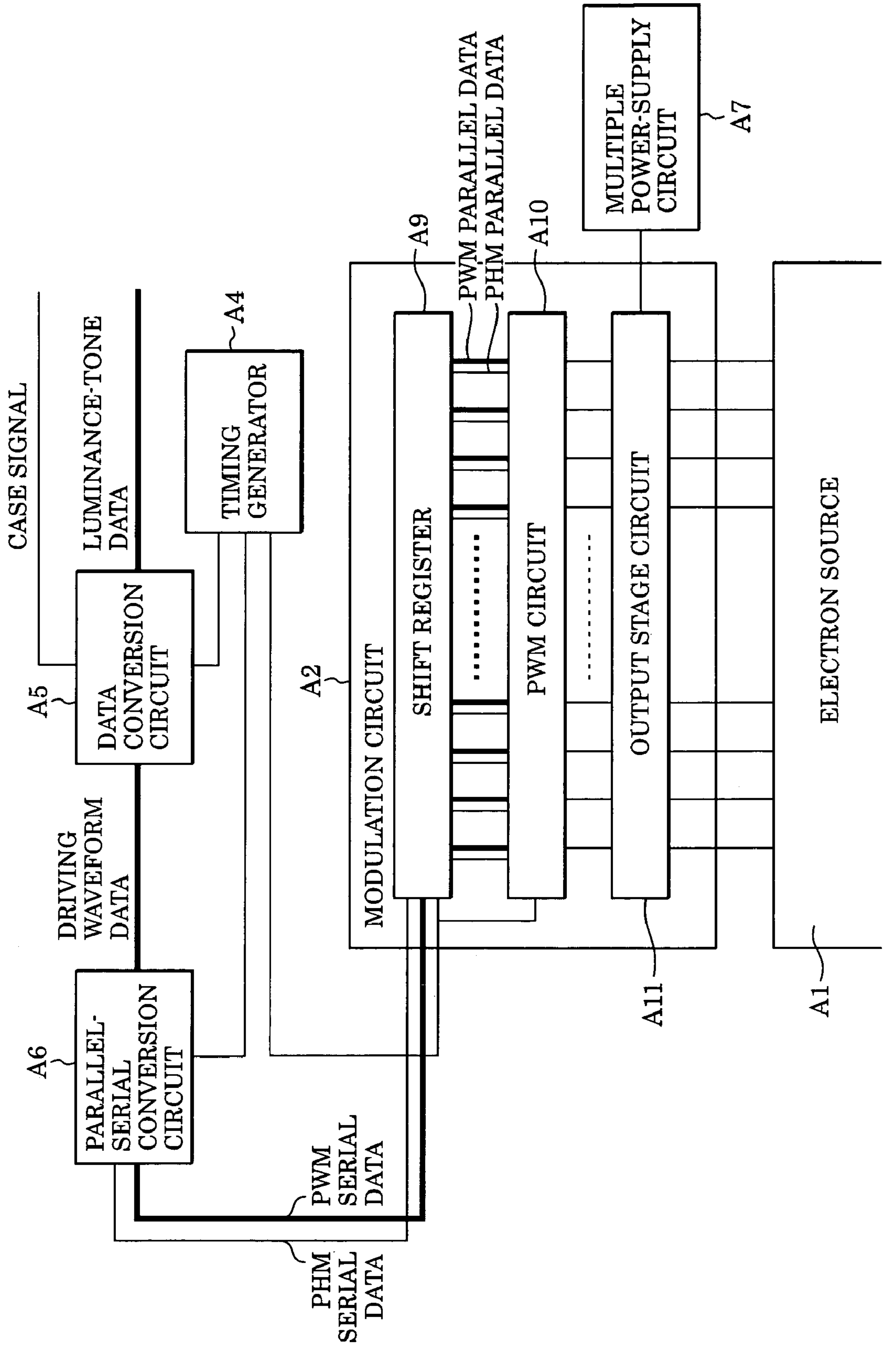
FIG. 2 is a block diagram showing the internal configuration of a modulation circuit in the driving unit in FIG. 1.

FIG. 2 is a block diagram showing the internal configuration of the modulation circuit A2. The modulation circuit A2 is described in detail next with reference to FIG. 2.

The modulation circuit A2 includes a shift register A9, a PWM circuit A10, and an output stage circuit A11.

The shift register A9 receives the PHM serial data and the PWM serial data converted by the parallel-serial conversion circuit A6 and transfers PHM parallel data and PWM parallel data, which are modulation data corresponding to the vertical lines of the electron source A1. The PWM circuit A10 receives the PHM parallel data and the PWM parallel data, which are the modulation data corresponding to the vertical lines of the electron source A1, from the shift register A9 to generate outputs corresponding to output voltages from the output stage circuit A11. The timing signals used for controlling the shift register A9 and the PWM circuit A10 are supplied from the timing generator A4. The output stage circuit A11 is connected to the multiple power-supply circuit A7 and outputs modulation signals having driving waveforms described below.

Figure 3:
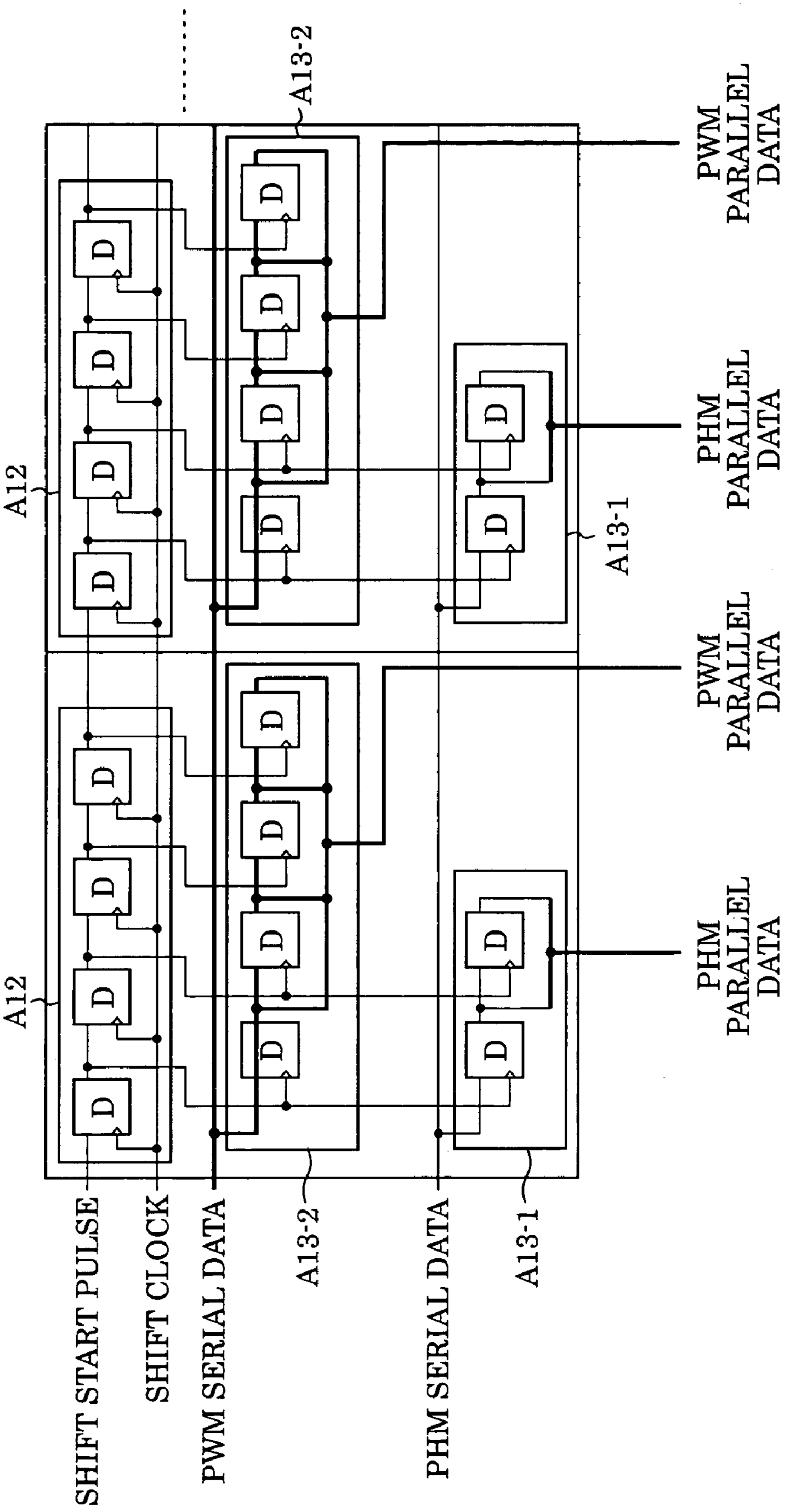
FIG. 3 is a block diagram showing the internal configuration of a shift register in the modulation circuit shown in FIG. 2.

FIG. 3 is a block diagram showing the internal configuration of the shift register A9. The shift register A9 is described in detail next with reference to FIG. 3.

The shift register A9 includes a plurality of control circuits A12 and a plurality of recording circuits A13. Although the control circuits A12 and the recording circuits A13 composed of delay (D) flip-flops are described here, the circuits are not limited to this configuration.

A first recording circuit A13-1 receives the PHM serial data converted by the parallel-serial conversion circuit A6 and transfers the PHM parallel data, which is the modulation data corresponding to the vertical lines of the electron source A1. A second recording circuit A13-2 receives the PWM serial data converted by the parallel-serial conversion circuit A6 and transfers the PWM parallel data, which is the modulation data corresponding to the vertical lines of the electron source A1. Each of the control circuits A12 receives a shift start pulse and a shift clock, which are the timing signals generated by the timing generator A4, to generate recording control signals used for recording the PHM serial data and the PWM serial data, which are the modulation data corresponding to the vertical lines (modulation lines) of the electron source A1, in the first and second recording circuits A13-1 and A13-2. The PHM serial data is recorded in the first recording circuit A13-1 and the PWM serial data is simultaneously recorded in the second recording circuit A13-2, in response to the recording control signals generated by the control circuits A12.

Figure 4:
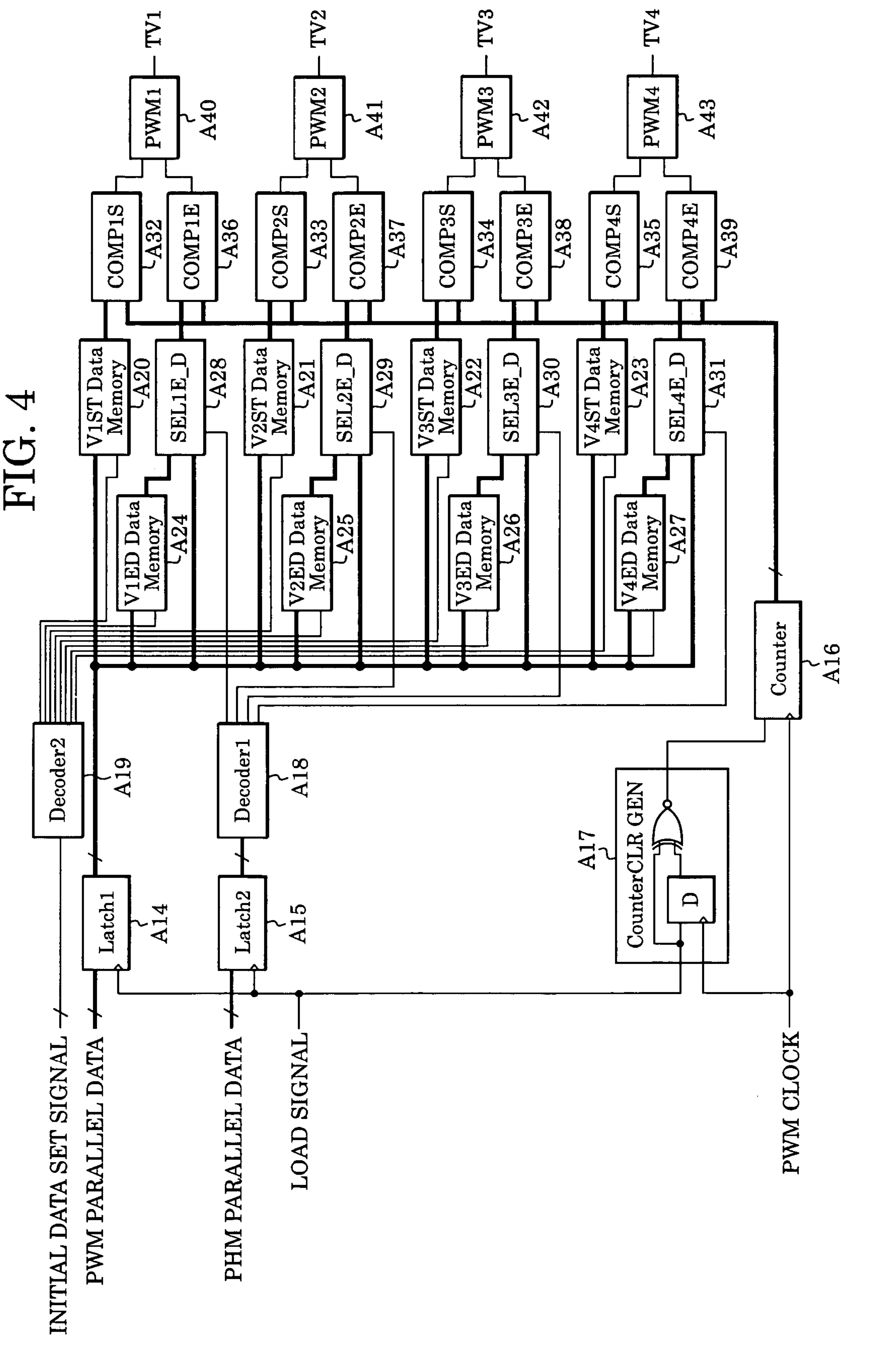
FIG. 4 is a block diagram showing a circuit in a PWM circuit in the modulation circuit shown in FIG. 2.

FIG. 4 is a block diagram showing an example of the circuit configuration provided for every vertical line as the PWM circuit A10 shown in FIG. 2. The PWM circuit A10 is described in detail next with reference to FIG. 4. The PWM circuit A10 is not limited to this circuit configuration.

The PWM circuit A10 includes a latch circuit A14 for the PWM parallel data, a latch circuit A15 for the PHM parallel data, a counter circuit A16, a counter-clear-signal generator circuit A17, a PHM data decoder circuit A18, an initial-data set signal decoder circuit A19, a V1 start data memory A20, a V2 start data memory A21, a V3 start data memory A22, a V4 start data memory A23, a V1 end data memory A24, a V2 end data memory A25, a V3 end data memory A26, a V4 end data memory A27, a V1 end data selection circuit A28, a V2 end data selection circuit A29, a V3 end data selection circuit A30, a V4 end data selection circuit A31, a V1 start data comparator A32, a V2 start data comparator A33, a V3 start data comparator A34, a V4 start data comparator A35, a V1 end data comparator A36, a V2 end data comparator A37, a V3 end data comparator A38, a V4 end data comparator A39, a V1 pulse-width generator circuit A40, a V2 pulse-width generator circuit A41, a V3 pulse-width generator circuit A42, and a V4 pulse-width generator circuit A43. Although the D flip-flop and an XOR circuit are used to form the counter-clear-signal generator circuit A17, the counter-clear-signal generator circuit A17 is not limited to this configuration.

The latch circuit A14 for the PWM parallel data latches the PWM parallel data, which is recorded in the second recording circuit A13-2 in the shift register A9 and which is the modulation data corresponding to the vertical lines of the electron source A1, in accordance with the timing of a load signal, which is one timing signal generated by the timing generator A4. The latch circuit A15 for the PHM parallel data latches the PHM parallel data, which is recorded in the first recording circuit A13-1 in the shift register A9 and which is the modulation data corresponding to the vertical lines of the electron source A1, in accordance with the timing of the load signal, which is one timing signal generated by the timing generator A4.

The counter-clear-signal generator circuit A17 generates a clear signal of a counter specifying internal timing from the load signal and a PWM clock, which are the timing signals generated by the timing generator A4. The counter circuit A16 supplies count data specifying the internal timing based on the PWM clock, which is one timing signal generated by the timing generator A4, and the counter clear signal, which is generated by the counter-clear-signal generator circuit A17, to the comparators from the V1 start data comparator A32 to the V4 end data comparator A39.

The PHM data decoder circuit A18 generates selection signals for the V1 end data selection circuit A28, the V2 end data selection circuit A29, the V3 end data selection circuit A30, and the V4 end data selection circuit A31 in accordance with the PHM parallel data latched by the latch circuit A15 for the PHM parallel data. The PHM data decoder circuit A18 generates the four selection signals for the two-bit PHM parallel data. When the PHM parallel data is equal to "00", the selection signal for the V1 end data selection circuit A28 is set to "1" and the selection signals for the remaining selection circuits are set to "0". "00" means a binary value. When the PHM parallel data is equal to "01", the selection signal for the V2 end data selection circuit A29 is set to "1" and the selection signals for the remaining selection circuits are set to "0". When the PHM parallel data is equal to "10", the selection signal for the V3 end data selection circuit A30 is set to "1" and the selection signals for the remaining selection circuits are set to "0". When the PHM parallel data is equal to "11", the selection signal for the V4 end data selection circuit A31 is set to "1" and the selection signals for the remaining selection circuits are set to "0".

The initial-data set signal decoder circuit A19 sequentially generates write signals used for recording the PWM parallel data (the data that serves as parameters used for setting the condition for forming the driving waveforms (a maximum time width available as the period controlled by each height value) and that is transmitted through the same path as that of the PWM data) latched by the latch circuit A14 for the PWM parallel data in the V1 start data memory A20, the V2 start data memory A21, the V3 start data memory A22, the V4 start data memory A23, the V1 end data memory A24, the V2 end data memory A25, the V3 end data memory A26, and the V4 end data memory A27, in accordance with an initial data set signal, which is one timing signal generated by the timing generator A4. The initial-data set signal decoder circuit A19 generates the eight write signals for the three-bit initial-data set signal. When the initial data set signal is set to "000", only the write signal for the V1 start data memory A20 is turned on and the PWM parallel data latched by the latch circuit A14 for the PWM parallel data is recorded in the V1 start data memory A20.

When the initial data set signal is set to "001", only the write signal for the V2 start data memory A21 is turned on and the PWM parallel data latched by the latch circuit A14 for the PWM parallel data is recorded in the V2 start data memory A21.

When the initial data set signal is set to "010", only the write signal for the V3 start data memory A22 is turned on and the PWM parallel data latched by the latch circuit A14 for the PWM parallel data is recorded in the V3 start data memory A22.

When the initial data set signal is set to "011", only the write signal for the V4 start data memory A23 is turned on and the PWM parallel data latched by the latch circuit A14 for the PWM parallel data is recorded in the V4 start data memory A23.

When the initial data set signal is set to "100", only the write signal for the V1 end data memory A24 is turned on and the PWM parallel data latched by the latch circuit A14 for the PWM parallel data is recorded in the V1 end data memory A24.

When the initial data set signal is set to "101", only the write signal for the V2 end data memory A25 is turned on and the PWM parallel data latched by the latch circuit A14 for the PWM parallel data is recorded in the V2 end data memory A25.

When the initial data set signal is set to "110", only the write signal for the V3 end data memory A26 is turned on and the PWM parallel data latched by the latch circuit A14 for the PWM parallel data is recorded in the V3 end data memory A26.

When the initial data set signal is set to "111", only the write signal for the V4 end data memory A27 is turned on and the PWM parallel data latched by the latch circuit A14 for the PWM parallel data is recorded in the V4 end data memory A27.

Parameters (V1 start data, V2 start data, V3 start data, V4 start data, V1 end data, V2 end data, V3 end data, and V4 end data) for forming the driving waveforms described below are sequentially transferred to the memories (from the V1 start data memory A20 to the V4 end data memory A27) as the luminance-tone data in a period during which images are not displayed and which includes the startup time of the unit, or when an instruction to transfer the parameters is given by a user or the characteristics of the tone data are varied, to record the parameters (V1 start data, V2 start data, V3 start data, V4 start data, V1 end data, V2 end data, V3 end data, and V4 end data) in the memories.

The V1 end data selection circuit A28 selects the PWM parallel data latched by the latch circuit A14 for the PWM parallel data or the V1 end data recorded in the V1 end data memory A24 in accordance with the selection signal corresponding to the PHM data supplied from the PHM data decoder circuit A18.

The V2 end data selection circuit A29 selects the PWM parallel data latched by the latch circuit A14 for the PWM parallel data or the V2 end data recorded in the V2 end data memory A25 in accordance with the selection signal corresponding to the PHM data supplied from the PHM data decoder circuit A18.

The V3 end data selection circuit A30 selects the PWM parallel data latched by the latch circuit A14 for the PWM parallel data or the V3 end data recorded in the V3 end data memory A26 in accordance with the selection signal corresponding to the PHM data supplied from the PHM data decoder circuit A18.

The V4 end data selection circuit A31 selects the PWM parallel data latched by the latch circuit A14 for the PWM parallel data or the V4 end data recorded in the V4 end data memory A27 in accordance with the selection signal corresponding to the PHM data supplied from the PHM data decoder circuit A18.

The V1 start data comparator A32 generates a V1 start pulse when the V1 start data recorded in the V1 start data memory A20 coincides with the count data specifying the internal timing, in the counter circuit A16.

The V2 start data comparator A33 generates a V2 start pulse when the V2 start data recorded in the V2 start data memory A21 coincides with the count data specifying the internal timing, in the counter circuit A16.

The V3 start data comparator A34 generates a V3 start pulse when the V3 start data recorded in the V3 start data memory A22 coincides with the count data specifying the internal timing, in the counter circuit A16.

The V4 start data comparator A35 generates a V4 start pulse when the V4 start data recorded in the V4 start data memory A23 coincides with the count data specifying the internal timing, in the counter circuit A16.

The V1 end data comparator A36 generates a V1 end pulse when the V1 end data or the PWM parallel data selected by the V1 end data selection circuit A28 coincides with the count data specifying the internal timing, in the counter circuit A16.

The V2 end data comparator A37 generates a V2 end pulse when the V2 end data or the PWM parallel data selected by the V2 end data selection circuit A29 coincides with the count data specifying the internal timing, in the counter circuit A16.

The V3 end data comparator A38 generates a V3 end pulse when the V3 end data or the PWM parallel data selected by the V3 end data selection circuit A30 coincides with the count data specifying the internal timing, in the counter circuit A16.

The V4 end data comparator A39 generates a V4 end pulse when the V4 end data or the PWM parallel data selected by the V4 end data selection circuit A31 coincides with the count data specifying the internal timing, in the counter circuit A16.

The V1 pulse-width generator circuit A40 is a PWM circuit outputting a pulse-width waveform TV1 that rises at the V1 start pulse generated by the V1 start data comparator A32 and falls at the V1 end pulse generated by the V1 end data comparator A36.

The V2 pulse-width generator circuit A41 is a PWM circuit outputting a pulse-width waveform TV2 that rises at the V2 start pulse generated by the V2 start data comparator A33 and falls at the V2 end pulse generated by the V2 end data comparator A37.

The V3 pulse-width generator circuit A42 is a PWM circuit outputting a pulse-width waveform TV3 that rises at the V3 start pulse generated by the V3 start data comparator A34 and falls at the V3 end pulse generated by the V3 end data comparator A38.

The V4 pulse-width generator circuit A43 is a PWM circuit outputting a pulse-width waveform TV4 that rises at the V4 start pulse generated by the V4 start data comparator A35 and falls at the V4 end pulse generated by the V4 end data comparator A39.

An example of the above PWM circuits is a reset set (RS) flip-flop that receives a start pulse as a set input and receives an end pulse as a reset input. However, the above PWM circuits are not limited to this circuit.

Figure 5:
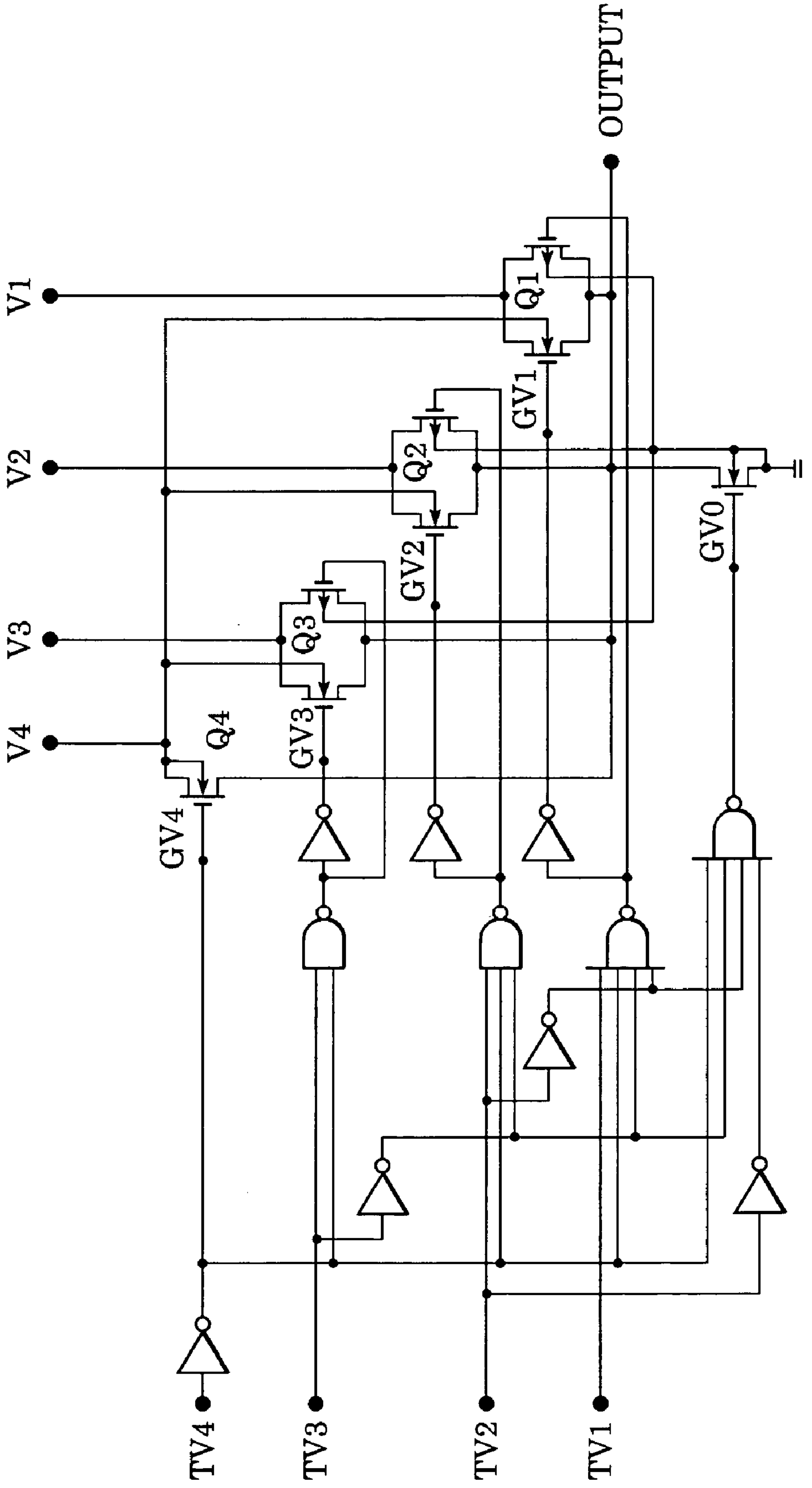
FIG. 5 is a circuit diagram showing the configuration of an output stage circuit in the modulation circuit shown in FIG. 2.

FIG. 5 is a circuit diagram showing the configuration of the output stage circuit A11 forming an output unit, shown in FIG. 2. The output stage circuit A11 is provided for every vertical line. Referring to FIG. 5, a voltage V4 is larger than a voltage V3 that is larger than a voltage V2. The voltage V2 is larger than a voltage V1 that is larger than zero. The voltages V1 to V4 are output in response to the pulse-width waveforms TV1 to TV4, respectively, which are PWM output waveforms. Paired transistors Q1 to Q3 and a transistor Q4 output the voltages V1 to V4, respectively, through an output terminal OUTPUT when the paired transistor Q1 to Q3 and the transistor Q4 are turned on. The connection between power supplies that supplies the voltages V1 to V4 and the vertical lines is controlled in response to the control signals generated based on the PWM output waveforms TV1 to TV4. The power supplies may be independent power supplies separated from each other. Alternatively, some of the power supplies may cause other power supplies to generate voltages by, for example, resistance division. Specifically, for example, one main electrode of the transistor is connected to the side toward the power supply supplying the voltage V1 and the other main electrode is connected to the side toward the vertical line. The control signals obtained from the PWM output waveforms TV1 to TV4 are supplied to the gate electrode, which is the control electrode of the transistor. When a field effect transistor (FET) is used, one main electrode serves as the source electrode and the other main electrode severs as the drain electrode. Turning on the transistor in response to the control signal supplies the voltage V1 to the vertical line through the transistor. Similarly, applying the control signal to the control electrode of the transistor connected between each power supply and the corresponding vertical line controls the connection between the power supply and the corresponding vertical line.

Figure 6:
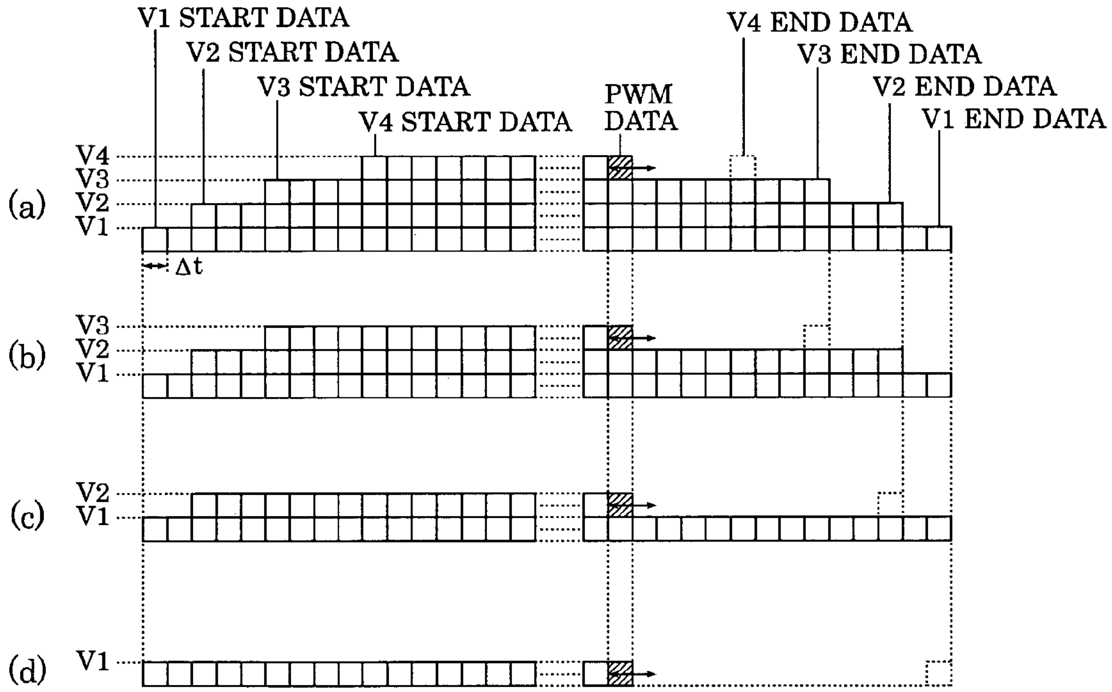
FIG. 6 illustrates examples of driving waveforms output from the output stage circuit in the modulation circuit shown in FIG. 2.

FIG. 6 illustrates driving waveforms output through the output terminal OUTPUT in FIG. 5. FIG. 6(*a*) shows a driving waveform when the PHM data is equal to "11" and the voltages V1 to V4 are used. The rising edge of the voltage V1 is specified by the V1 start data stored in the V1 start data memory A20, the rising edge of the voltage V2 is specified by the V2 start data stored in the V2 start data memory A21, the rising edge of the voltage V3 is specified by the V3 start data stored in the V3 start data memory A22, and the rising edge of the voltage V4 is specified by the V4 start data stored in the V4 start data memory A23. The falling edge of the voltage V1 is specified by the V1 end data stored in the V1 end data memory A24, the falling edge of the voltage V2 is specified by the V2 end data stored in the V2 end data memory A25, the falling edge of the voltage V3 is specified by the V3 end data stored in the V3 end data memory A26, and the falling edge of the voltage V4 is specified by the PWM data.

FIG. 6(*b*) shows a driving waveform when the PHM data is equal to "10" and the voltages V1 to V3 are used. The rising edge of the voltage V1 is specified by the V1 start data stored in the V1 start data memory A20, the rising edge of the voltage V2 is specified by the V2 start data stored in the V2 start data memory A21, and the rising edge of the voltage V3 is specified by the V3 start data stored in the V3 start data memory A22. The falling edge of the voltage V1 is specified by the V1 end data stored in the V1 end data memory A24, the falling edge of the voltage V2 is specified by the V2 end data stored in the V2 end data memory A25, and the falling edge of the voltage V3 is specified by the PWM data.

FIG. 6(*c*) shows a driving waveform when the PHM data is equal to "01" and the voltages V1 to V2 are used. The rising edge of the voltage V1 is specified by the V1 start data stored in the V1 start data memory A20 and the rising edge of the voltage V2 is specified by the V2 start data stored in the V2 start data memory A21. The falling edge of the voltage V1 is specified by the V1 end data stored in the V1 end data memory A24 and the falling edge of the voltage V2 is specified by the PWM data.

FIG. 6(*d*) shows a driving waveform when the PHM data is equal to "00" and the voltage V1 is used. The rising edge of the voltage V1 is specified by the V1 start data stored in the V1 start data memory A20. The falling edge of the voltage V1 is specified by the PWM data.

Figure 7:
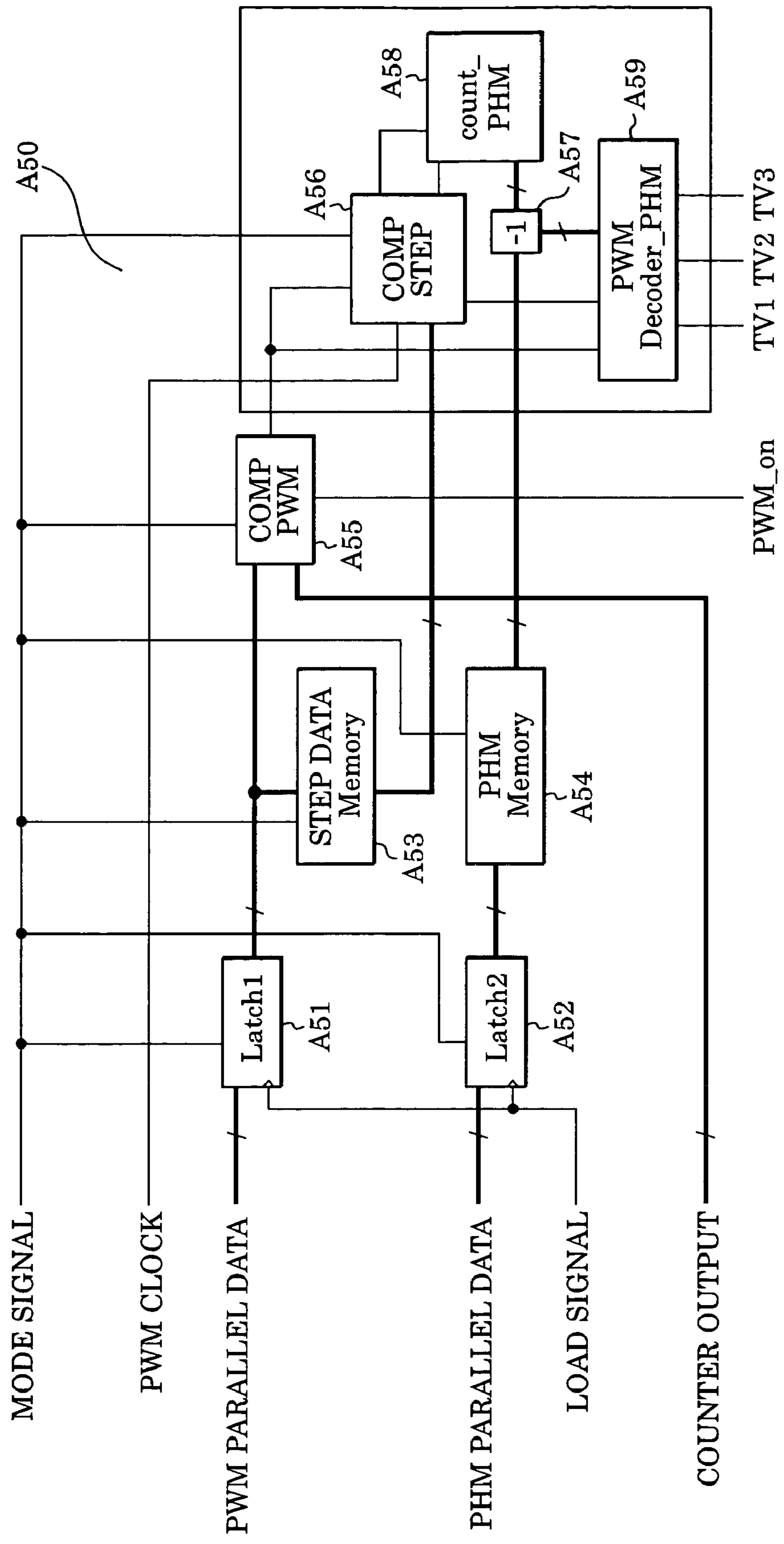
FIG. 7 is a block diagram showing a falling waveform circuit in the PWM circuit in the modulation circuit shown in FIG. 2.

The PWM circuit A10 according to this embodiment includes a falling waveform circuit A50 shown in FIG. 7, in addition to the circuit in FIG. 4. Either a mode in which the rising edges and the falling edges of the driving waveform are set by using the circuit in FIG. 4 or a mode in which the rising edges of the driving waveform are set by using the circuit in FIG. 4 and the falling edges of the driving waveform are set by using the circuit in FIG. 7 is selected. The latter mode is hereinafter simply referred to as a PWM drive mode.

FIG. 7 is a block diagram showing the falling waveform circuit A50 used for generating a falling waveform in PWM drive mode. The falling waveform circuit A50 includes a latch circuit A51 for the PWM parallel data, a latch circuit A52 for the PHM parallel data, a number-of-falling-steps memory A53, a PHM parallel data memory A54, a PWM parallel data comparator circuit A55, a number-of-steps comparator circuit A56, a data subtracter A57, a PHM counter circuit A58, and a PWM pulse-width circuit A59.

The latch circuit A51 for the PWM parallel data latches the PWM parallel data, which is recorded in the second recording circuit A13-2 in the shift register A9 and which is the modulation data corresponding to the vertical lines of the electron source A1, in accordance with the timing of the load signal, which is one timing signal generated by the timing generator A4.

The latch circuit A52 for the PHM parallel data latches the PHM parallel data, which is recorded in the first recording circuit A13-1 in the shift register A9 and which is the modulation data corresponding to the vertical lines of the electron source A1, in accordance with the timing of the load signal, which is one timing signal generated by the timing generator A4.

The number-of-falling-steps memory A53 records data concerning the number of steps in response to a MODE signal, which is one timing signal generated by the timing generator A4. The data concerning the number of steps is transferred through a bus for the PWM parallel data.

The PHM parallel data memory A54 records the PHM parallel data.

The PWM parallel data comparator circuit A55 generates a pulse when the PWM data coincides with the count data specifying the internal timing, in the counter circuit A16.

The number-of-steps comparator circuit A56 generates a pulse when the data concerning the number of steps, which data is used for setting the output period of each voltage at the falling edge of the waveform, coincides with the count data specifying the internal timing, in the counter circuit A16.

The data subtracter A57 subtracts one from the PHM data recorded in the PHM parallel data memory A54 and stores the subtracted value.

The PHM counter circuit A58 counts the pulse output from the number-of-steps comparator circuit A56 as a count pulse, and outputs a signal for stopping the operation of the number-of-steps comparator circuit A56 when the count pulse coincides with the value output from the data subtracter A57.

The PWM pulse-width circuit A59 outputs the falling timing of each voltage from the pulse output from the number-of-steps comparator circuit A56 and the value output from the data subtracter A57.

The operation of the circuits (shown in FIG. 4 and FIG. 7) is described next.

In the period during which images are not displayed and which includes the startup time of the unit, the parameters used for forming the driving waveforms, the V1 to V4 start data, the V1 to V4 end data, and the data concerning the number of steps are sequentially transferred as the luminance-tone data to store the parameters and the data in the memories. Adjusting the number of steps allows the characteristics of the brightness with respect to tone data to be varied in a manner described below. Although the circuit configuration in which the data used for setting the maximum time width available as the period controlled by each height value is transmitted through the same path as that of the luminance-tone data and is stored in the PWM circuit is described above, this circuit configuration is not limitedly used. Such data may be transmitted through a path different from the path of the luminance-tone data.

When a first driving mode (hereinafter also referred to as the PWM drive for simplicity) is selected in response to the MODE signal, the PWM parallel data comparator circuit A55 compares the PWM data with the counter value. If the PWM data coincides with the counter value, the PWM parallel data comparator circuit A55 supplies a pulse for starting the operation to the number-of-steps comparator circuit A56 and a selector A60 described below.

The number-of-steps comparator circuit A56 compares the data concerning the number of steps, used for setting the output period of each voltage at the falling edge of the waveform, with the count data specifying the internal timing, in the counter circuit A16. If the step data coincides with the count data, the number-of-steps comparator circuit A56 supplies a pulse to the PHM counter circuit A58 and the PWM pulse-width circuit A59.

The PHM counter circuit A58 compares the value output from the data subtracter A57 with the number of the pulses output from the number-of-steps comparator circuit A56. If the value coincides with the number of the pulses, the PHM counter circuit A58 stops the operation of the number-of-steps comparator circuit A56. If the value does not coincide with the number of pulses, the PHM counter circuit A58 resets the counter value of the number-of-steps comparator circuit A56 and starts the comparison with the step data again.

The PWM pulse-width circuit A59 receives the pulse output from the PWM parallel data comparator circuit A55.

(1) If the voltage corresponding to the value of the PHM data in the data subtracter A57 is equal to, for example, the voltage V3, the PWM pulse-width circuit A59 outputs the pulse-width waveforms TV1 to TV3 for the falling edges of the waveforms of the voltages less than or equal to the voltage V3.

(2) If the voltage corresponding to the value of the PHM data in the data subtracter A57 is equal to, for example, the voltage V2, the PWM pulse-width circuit A59 outputs the pulse-width waveforms TV1 to TV2 for the falling edges of the waveforms of the voltages less than or equal to the voltage V2.

(3) If the voltage corresponding to the value of the PHM data in the data subtracter A57 is equal to, for example, the voltage V1, the PWM pulse-width circuit A59 outputs the pulse-width waveform TV1 for the falling edge of the waveform of the voltage V1.

Each time the pulse output from the number-of-steps comparator circuit A56 is detected, the PWM pulse-width circuit A59 operates so as to output a subsequent voltage (lower voltage). Repeating this operation until the driving waveform reaches a ground (GND) level forms the falling edges of the waveform in the PWM drive.

Figure 8:
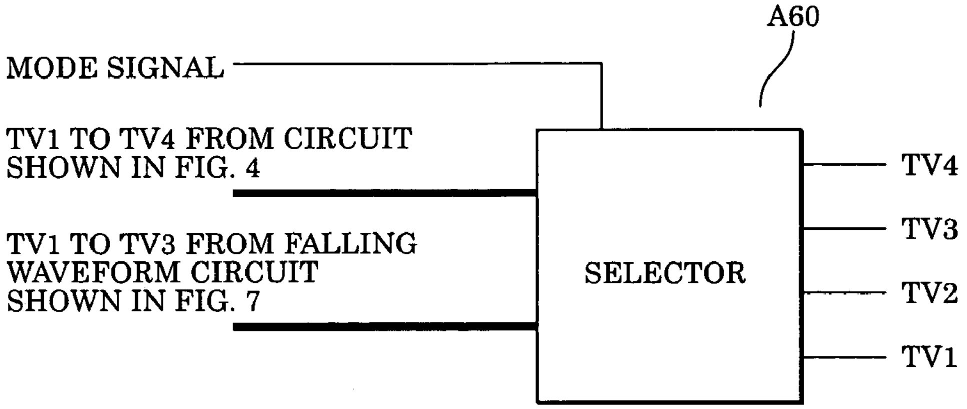
FIG. 8 illustrates a selector according to an embodiment of the present invention.

As shown in FIG. 8, the pulse-width waveforms TV1 to TV3 output from the falling waveform circuit A50 are supplied to the selector A60. The PWM output waveforms TV1 to TV4 from the circuit shown in FIG. 4 are also supplied to the selector A60.

In the second driving mode (hereinafter also referred to as normal drive for simplicity), the selector A60 causes the PWM output waveforms TV1 to TV4 supplied from the circuit shown in FIG. 4 to pass through and transmits the PWM output waveforms TV1 to TV4 to the output stage circuit A11 in FIG. 5.

A case in which the PWM drive is selected in response to the MODE signal is described next.

The selector A60 functions in response to an output signal PWM_on supplied from the PWM parallel data comparator circuit A55. Specifically, the selector A60 functions as follows:

(1) The selector A60 normally drives before the output signal PWM_on is input. In other words, the selector A60 causes "the PWM output waveforms TV1 to TV4 supplied from the circuit shown in FIG. 4" to pass through.

(2) The selector A60 selects "the pulse-width waveforms TV1 to TV3 supplied from the falling waveform circuit A50" after the output signal PWM_on is received and outputs the selected pulse-width waveforms TV1 to TV3.

Figure 9:
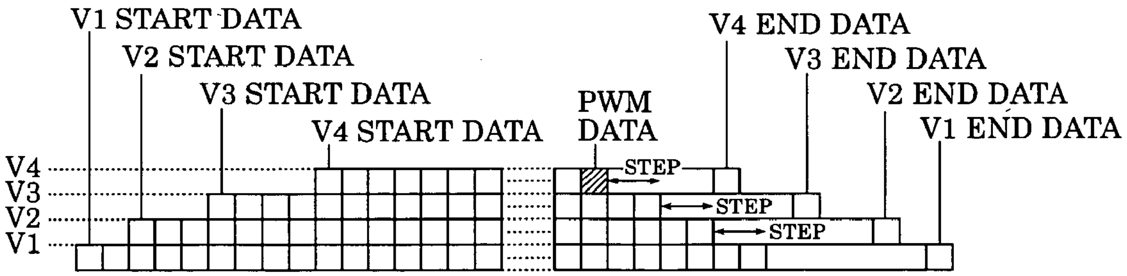
FIG. 9 illustrates an example of the driving waveform used in the driving unit according to the embodiment of the present invention.
Figure 10:
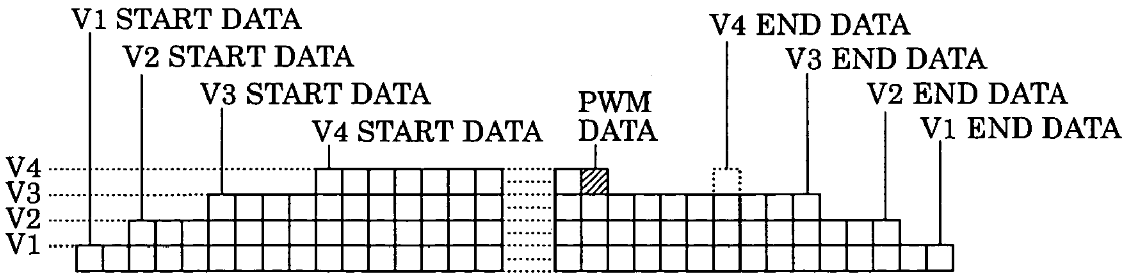
FIG. 10 illustrates another example of the driving waveform used in the driving unit according to the embodiment of the present invention.

FIG. 9 illustrates the driving waveform when the PWM drive is selected in response to the MODE signal. FIG. 10 illustrates the same driving waveform as in FIG. 6(*a*) (the normal waveform).

In the PWM drive, the same driving waveform as the normal waveform appears before the position which is designated by the PWM data (a shaded block in FIG. 9). However, after the position which is designated by the PWM data (the shaded block in FIG. 9), the voltage V3, which is lower than the voltage V4 by one level, is output for a time corresponding to the number of steps (two in FIG. 9). Then, the voltage V2 is output for a time corresponding to the number of steps (two in FIG. 9). The same operation is repeated until the driving waveform reaches the GND level to form the waveform for the PWM drive.

Figure 11:
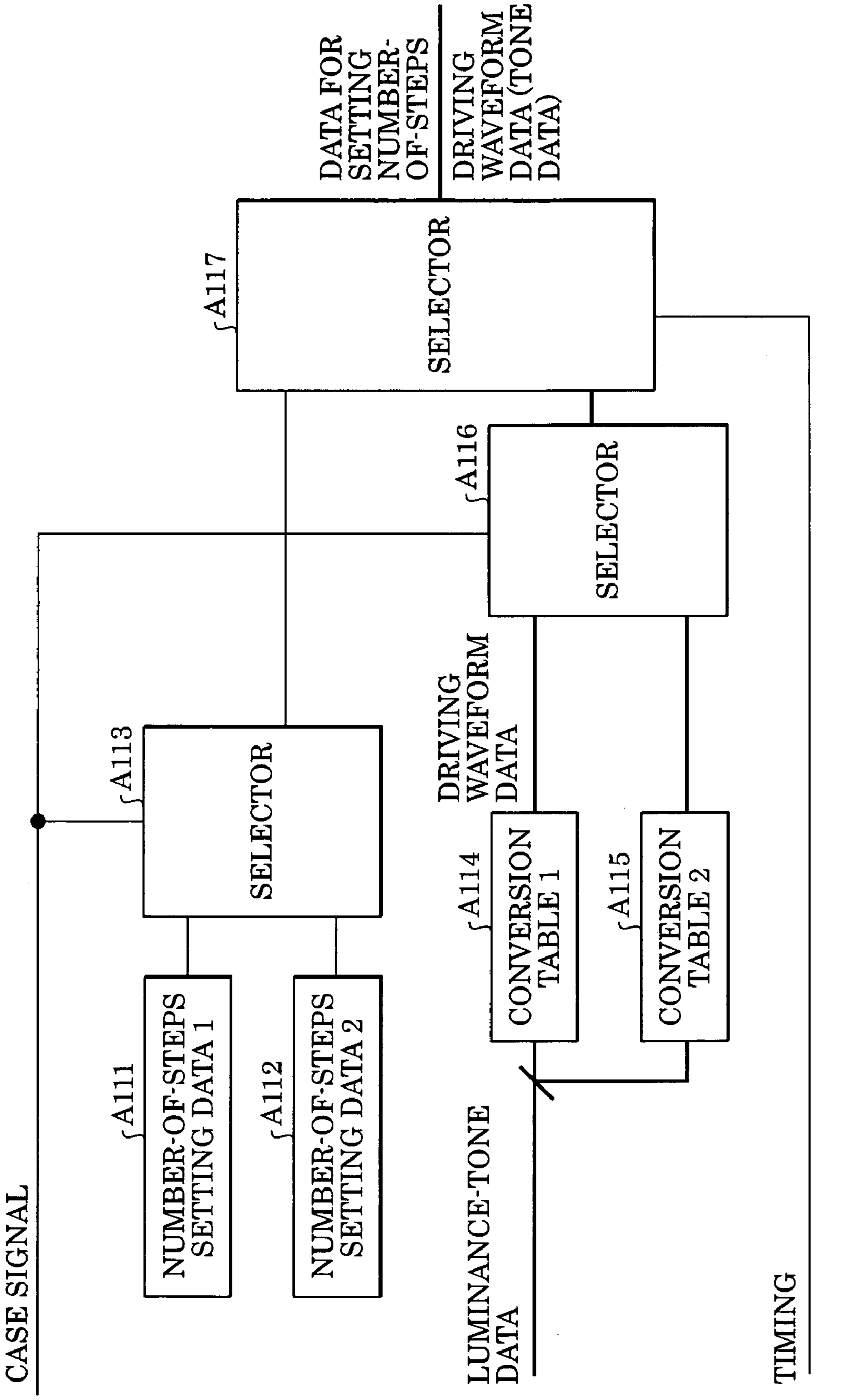
FIG. 11 is a block diagram showing in detail a data conversion circuit in the driving unit according to the embodiment of the present invention.

FIG. 11 is a block diagram showing in detail the data conversion circuit A5 shown in FIGS. 1 and 2.

In the following description, the number of forward steps until the driving waveform rises is set to 4, 4, and 4 when a case signal 1 is used, and the number of forward steps until the driving waveform rises is set to 4, 64, and 64 when a case signal 2 is used. In other words, the V1 to V4 start data in the circuit in FIG. 4 is set such that the number of steps is set to the above values. Specifically, the V2 start data is set such that the height value rises to the value of the V1 start data and, after four clocks, rises to the value of the V2 start data. This setting causes the time width available as the period, at the front end of the driving waveform, in which the height value is set to the value of the V1 start data to be set to four clock periods. The same applies to the time widths for the V2 to V4 start data. The number of backward steps is set to 4. This number of backward steps is recorded in the number-of-falling-steps memory A53 in FIG. 7.

Number-of-steps setting data 1 A111 has values of 4, 4, 4, 4, 4, and 4.

These six values represent a forward step from the voltage V1 to the voltage V2, a forward step from the voltage V2 to the voltage V3, a forward step from the voltage V3 to the voltage V4, a backward step from the voltage V4 to the voltage V3, a backward step from the voltage V3 to the voltage V2, and a backward step from the voltage V2 to the voltage V1, respectively. These values are selected by a selector A113 when the case signal 1 is used. These values are selected and output by a selector A117 at the first timing of a frame. The number-of-steps setting data is recorded in the PWM circuit A10. The driving waveform is subsequently output based on the parameters and luminance data (the PWM data or the PHM data) to be displayed. Specifically, the number of steps until the rising edge appears in each height value toward the peak height value of the driving waveform specified by the PHM data is determined based on the parameters. The timing at which the falling from the peak height value of the driving waveform is to be started is determined based on the PWM data and, then, the number of steps until the falling edge appears in each height value lower than the maximum height value of the driving waveform is determined based on the number-of-steps setting data.

A conversion table optimized for the above number of steps is stored in a conversion table 1 A114. The luminance data that passes through the conversion table 1 A114 to be converted into the driving waveform data (PHM data or the PWM data) is selected by a selector A116 when the case signal 1 is used. Since these values are selected by the selector A117 in parts other than the first timing of the frame, the driving waveform corresponding to the luminance when the case signal 1 is used is output by using the driving wave form data (PHM data or the PWM data) and the parameters which are preliminarily recorded in the memories in the PWM circuit A10.

Number-of-steps setting data 2 A112 has values of 4, 64, 64, 4, 4, and 4. The V1 to V4 start data and the data in the number-of-falling-steps memory A53 are set so as to satisfy this condition.

Since these values are selected by the selector A113 when the case signal 2 is used, these values are output at the first timing of the frame. A conversion table optimized for the above number of steps is stored in a conversion table 2 A115. The luminance data that passes through the conversion table 2 A115 to be converted into the driving waveform data is selected by a selector A116 when the case signal 2 is used. Since these values are selected by the selector A117 in parts other than the first timing of the frame, the driving waveform corresponding to the luminance when the case signal 2 is used is output.

The optimized conversion table 1 A114 and conversion table 2 A115 convert the input tone data into the driving waveform data. The values in the conversion table 1 A114 and conversion table 2 A115 are determined such that the brightness in the display is matched to the tone data. Accordingly, not only the driving waveform but also the display characteristics of, for example, the fluorescent material in the display are considered in the conversion table 1 A114 and conversion table 2 A115. According to another embodiment of the present invention, a table for matching the display characteristics of the display to the tone data may be separately provided and the multiple conversion tables of this embodiment may be used only for the switching of the driving waveform.

As described above, when the driving waveform is varied and the number of tones is increased, providing a conversion table for every driving waveform and switching the conversion tables in accordance with the driving waveforms allow a predetermined tone characteristic to be maintained, regardless of a change in the display mode.

Figure 12:
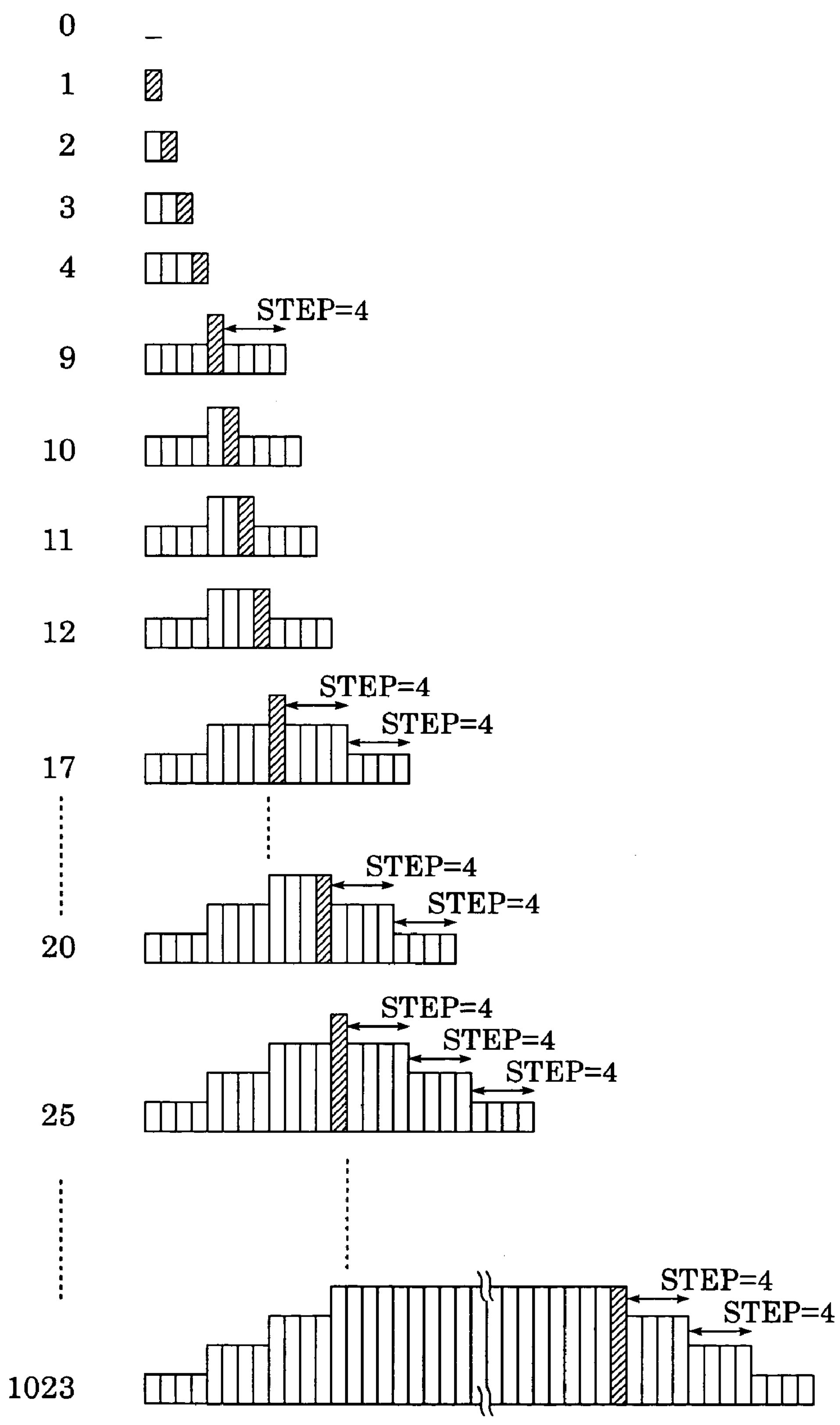
FIG. 12 shows a PWM driving waveform example used in the driving unit according to the embodiment of the present invention.

FIG. 12 shows a PWM driving waveform example 1.

Referring to FIG. 12, the number of rising steps is set to "4, 4, and 4", and the number of falling steps is set to "4, 4, and 4".

Shifting the position of the PWM data (the shaded block) as shown in FIG. 12 can form the waveform for the PWM drive.

Figure 13:
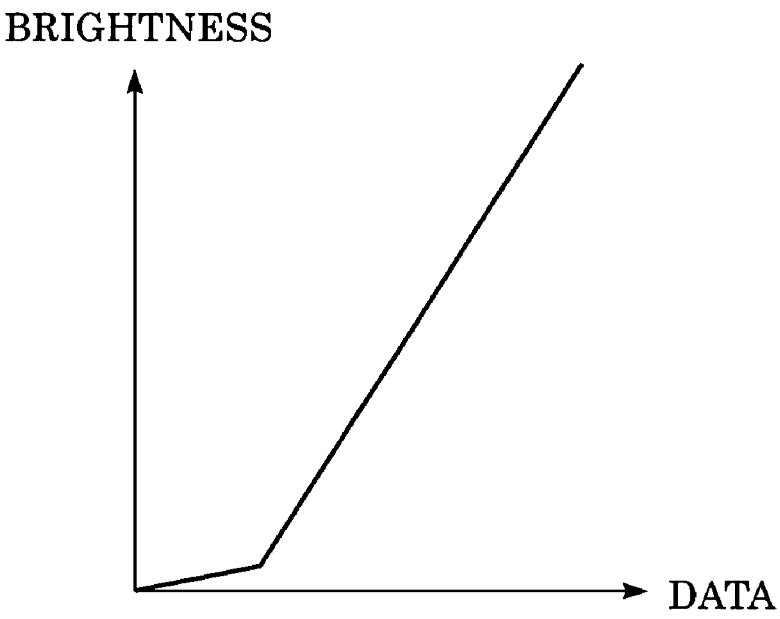
FIG. 13 is a graph showing the relationship between the values of driving waveform data and tone (brightness) in the PWM driving waveform example shown in FIG. 12.

FIG. 13 is a graph showing the relationship between the values of the driving waveform data and the display tone (brightness) in the PWM driving waveform example 1. The brightness is given by integrating the values of the luminance in a period during which one line is selected.

Since the period of a height value V1 is prolonged as the value of the driving waveform data is increased when the driving waveform data has values of one to eight, the brightness is substantially linearly increased with increase in the value of the driving waveform data. When a driving waveform data has values of nine to 16, the period of the height value V1 occupies eight steps, which is the upper limit, and the period of a height value V2 is prolonged as the value of the driving waveform data is increased. Accordingly, the brightness is substantially linearly increased with increase in the value of the driving waveform data. However, since the height value in sections whose time width increases with increase in the value of the driving waveform data is larger than that when the driving waveform data has values of one to eight, the gradient of the characteristic line on a coordinate where the horizontal axis represents the driving waveform data and the vertical axis represents the brightness becomes steeper. When the driving waveform data has values of 17 to 24, the period of the height value V1 occupies eight steps, which is the upper limit, the period of the height value V2 occupies eight steps, which is the upper limit, and the period of a height value V3 is prolonged as the value of the driving waveform data is increased. Accordingly, the brightness is substantially linearly increased with increase in the value of the driving waveform data. However, since the height value in the sections whose time width increases with increase in the value of the driving waveform data is larger than that when the driving waveform data has values of one to eight and is also larger than that when the driving waveform data has values of nine to 16, the gradient of the characteristic line on the coordinate where the horizontal axis represents the driving waveform data and the vertical axis represents the brightness becomes steeper. When the driving waveform data has values of 25 or more, the period of a height value V4 is prolonged as the value of the driving waveform data is increased. The gradient of the characteristic line in this section is steeper than that in the section where the driving waveform data has values of one to 24. In order to avoid providing an obscure graph, it is presumed in FIG. 13 that the characteristic line has a constant gradient in the section where the driving waveform data has values of one to 24, despite the fact that the gradient of the characteristic line is actually varied in the manner described above.

In the PWM driving waveform example 1, the period of the height value V4 occupies as many as 999 steps in full tone (1023), so that the brightness has a higher maximum value.

Figure 14:
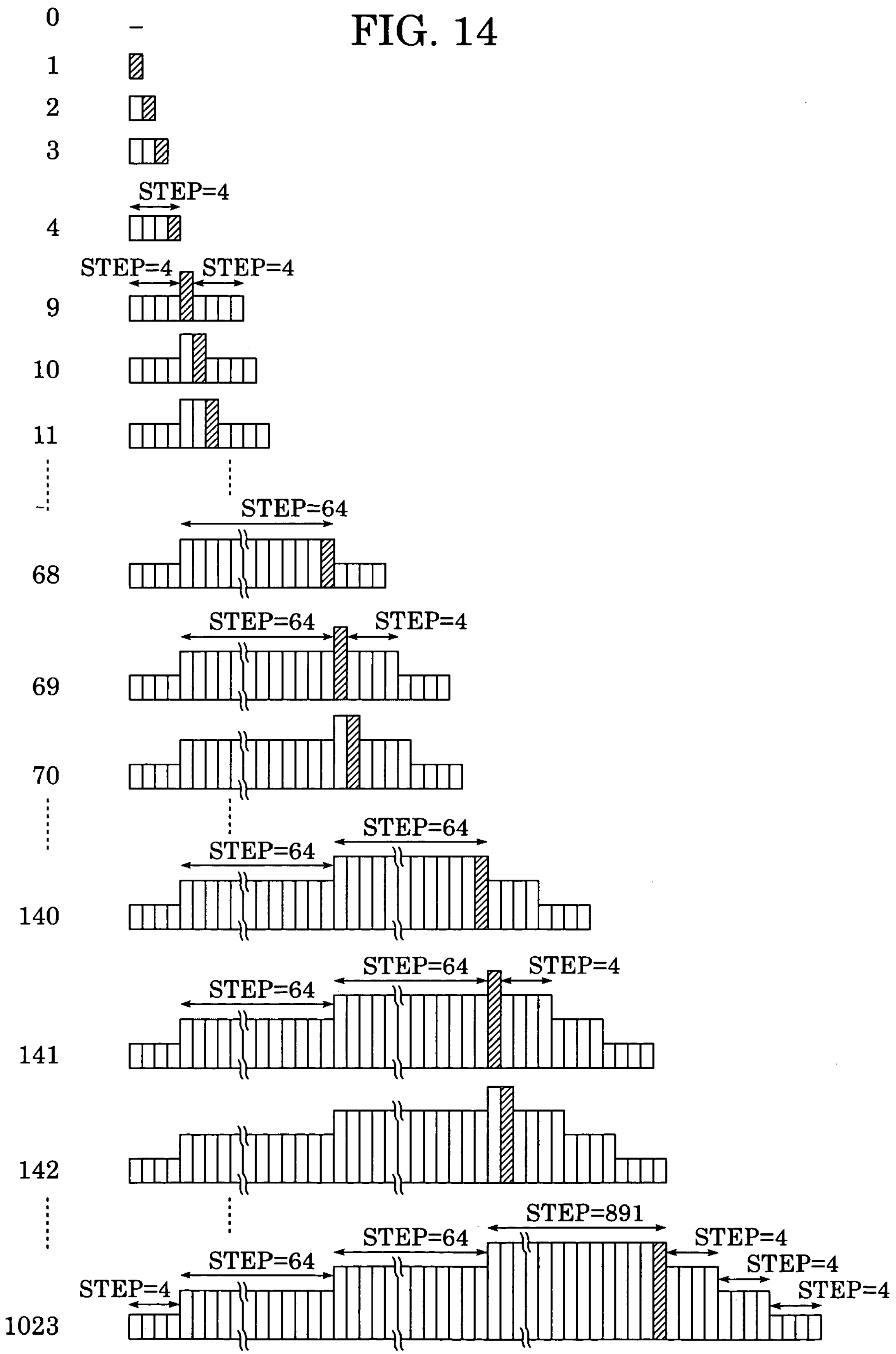
FIG. 14 shows another PWM driving waveform example.

FIG. 14 shows a PWM driving waveform example 2.

Referring to FIG. 14, the number of rising steps is set to "4, 64, and 64", and the number of falling steps is set to "4, 4, and 4". Accordingly, the maximum time width available as the period controlled by the height value V1 is 8 (=4+4). The maximum time width available as the period controlled by the height value V2 is 68 (=64+4). The maximum time width available as the period controlled by the height value V3 is 68 (=64+4).

Shifting the position of the PWM data (the shaded block) as shown in FIG. 14 can form the waveform for the PWM drive.

Figure 15:
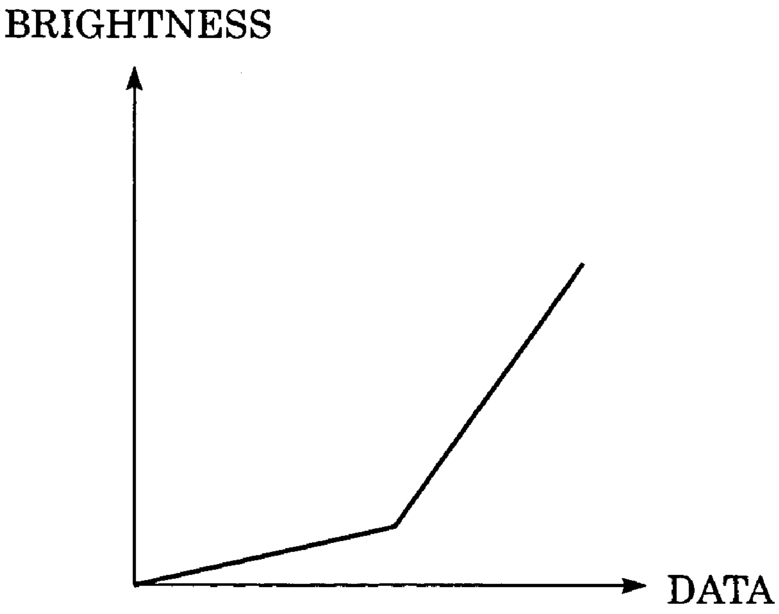
FIG. 15 is a graph showing the relationship between the values of the driving waveform data and the tone (brightness) in the PWM driving waveform example shown in FIG. 14.

FIG. 15 is a graph showing the relationship between the values of the driving waveform data and the display tone (brightness) in the PWM driving waveform example 2.

Since many tones are supported at the lower voltages including the voltage V2 and the voltage V3 before the voltage V4 is used in the PWM driving waveform example 2, superior tone reproducibility is achieved in the dark area.

As described above, since the waveform having a higher maximum brightness value is generated when the case signal 1 is used and the waveform having superior tone reproducibility in the dark area is generated when the case signal 2 is used, the case signals 1 and 2 are selectively used as needed.

Figure 16:
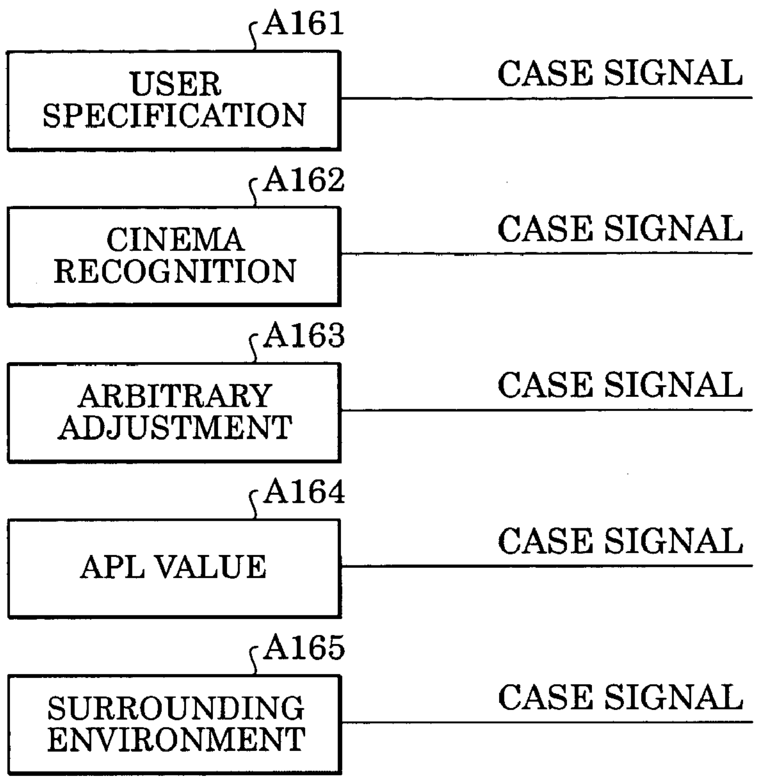
FIG. 16 illustrates examples in which case signals are switched.

FIG. 16 illustrates examples in which the case signals are switched.

In an example A161, the case signals are switched in accordance with an instruction from a user. For example, a case 1 corresponds to brightness priority, which is called a dynamic mode in a commercial television set, and a case 2 corresponds to tone smoothness priority in darker areas, which priority is called a cinema mode. The user can select the case 1 or the case 2. The number of cases is not limited to two and any number of cases may be used.

In an example A162, the case signals are switched based on recognition of a video source as a cinema.

Since the video source recognized as a cinema is converted from a 24-Hz progressive scan mode to a 60-Hz interlace scan mode, a person skilled in the art can recognize the cinema based on the regularity between frames by a known interlace-to-progressive (IP) conversion method. For example, a case 2 corresponds to a case in which the video source is recognized as a cinema by cinema recognition means, and a case 1 corresponds to a case to which the case 2 is not applied. In this example A162, it is possible to express dark videos, which are specific to cinemas, with superior tone reproducibility without an operation by the user.

In an example A163, the user sets an arbitrary number of steps. In a commercial television set, so-called user adjustment 1 and user adjustment are assigned to cases 1 and 2 each having an arbitrary number of steps set therein. The number of cases is not limited to two and any number of cases may be set.

In an example A164, the case signals are switched based on the value of an average picture level (APL). For example, an APL value within a range from 0.3 to 0.6 provides a picture having appropriate brightness. In such a case, the case 1 is used to increase the brightness.

Since an APL value of 0.3 or less provides a dark picture, the case 2 is used to display the picture with weight being given to the darker tone.

Since an APL value of 0.6 or more suppress the display of areas having higher brightness due to an automatic brightness limiter (ABL), the higher-brightness areas in the case 1 are not required and, therefore, the case 2 is used. Switching the case signals based on the APL value allows the display apparatus to always fulfill its function.

In an example A165, the case signals are switched based on the ambient brightness.

The illuminance of a place where a television set is provided is monitored in the example A165. A case 1 is used when the illuminance is higher than a predetermined value and a case 2 is used when the illuminance is lower than the predetermined value. Although the tone is not considered in related arts when the brightness in the display is varied in accordance with the ambient brightness, it is possible to vary the brightness in the display with no performance penalty of the display apparatus according to the embodiment of the present invention.

Figure 17:
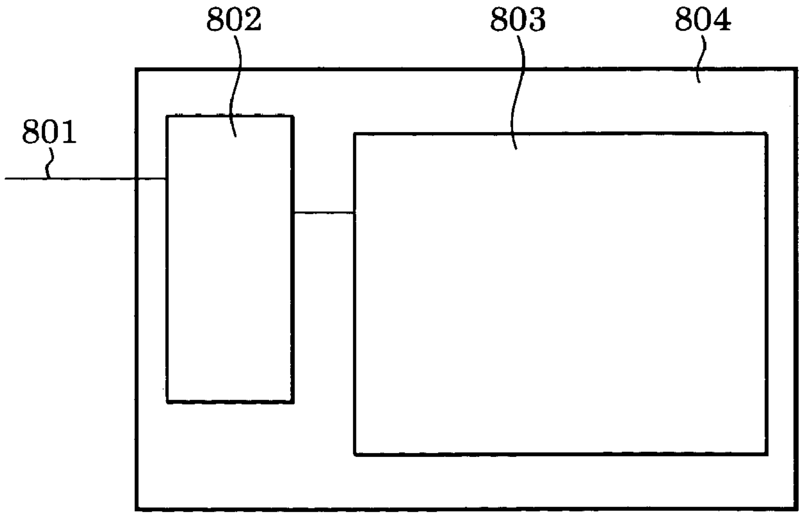
FIG. 17 shows an example of the structure of a television set according to an embodiment of the present invention.

FIG. 17 shows the structure of a television set 804 using the image display apparatus shown in FIG. 1. Referring to FIG. 17, the television set 804 includes a tuner 802 for television broadcasting signals and an image display apparatus 803 as shown in FIG. 1. Signals 801 for the television broadcasting are supplied to the tuner 802. The tuner 802 extracts a desired signal from the received signals 801 and supplies the extracted signal to the image display apparatus 803. The image display apparatus 803 displays a television program based on the signal supplied from the tuner 802.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-193474 filed Jun. 30, 2004 and Patent Application No. 2005-183270 filed Jun. 23, 2005, which are hereby incorporated by reference herein.

What is claimed is:

1. An apparatus for generating a modulation signal whose height value and the time width thereof are controlled in accordance with an input value of luminance-tone data, said apparatus comprising:

a control circuit; and an output section, wherein the control circuit defines a maximum time width which is available as a time width of a first height value of the modulation signal and sets a predetermined value of luminance-tone data corresponding to the modulation signal whose first-height-value time width is controlled so as to be the maximum time width, wherein the output section outputs, when an input value of the luminance-tone data is not more than the predetermined value, the modulation signal whose first-height-value time width is controlled so that the upper limit of the first-height-value time width is the maximum time width in accordance with the input value of the luminance-tone data, and the output section outputs, when the input value of the luminance-tone data is higher than the predetermined value, the modulation signal whose first-height-value time width is controlled to be the maximum time width and whose time width of a second height value, which is higher than the first height value, is controlled in accordance with a value which exceeds the predetermined value in a period which is different from a period in which the first height value is controlled, and wherein the control circuit changes the maximum time width in accordance with a signal input to the control circuit and changes the predetermined value in accordance with the signal input to the control circuit.

2. An apparatus according to claim 1, wherein the signal input to the control circuit includes a signal generated based on a user's instruction.

3. An image display apparatus comprising:

an apparatus to claim 1; and an image display section having a plurality of display elements.

4. An image display apparatus according to claim 3, wherein the display elements comprise an electron emission element and a fluorescent material which emits light when the fluorescent material is irradiated with electrons emitted from the electron emission element.

5. A television apparatus comprising:

a tuner for television broadcasting signals; and an image display apparatus according to claim 3, which displays an image based on a signal output from the tuner.

* * * * *